US 7,057,338 B2

(12) United States Patent
Hamada et al.

(10) Patent No.: US 7,057,338 B2
(45) Date of Patent: Jun. 6, 2006

(54) ORGANIC ELECTROLUMINESCENT DISPLAY AND METHOD OF MANUFACTURING THE SAME

(75) Inventors: Yuji Hamada, Nara (JP); Kazuki Nishimura, Hirakata (JP)

(73) Assignee: Sanyo Electric Co., Ltd., Osaka (JP)

( * ) Notice: Subject to any disclaimer, the term of this patent is extended or adjusted under 35 U.S.C. 154(b) by 258 days.

(21) Appl. No.: 10/378,598

(22) Filed: Mar. 5, 2003

(65) Prior Publication Data

US 2003/0168972 A1     Sep. 11, 2003

(30) Foreign Application Priority Data

Mar. 5, 2002     (JP)     ............................. 2002-059536

(51) Int. Cl.
*H05B 33/00*     (2006.01)
(52) U.S. Cl. ...................................... 313/504; 313/506
(58) Field of Classification Search ................ 313/504, 313/506; 428/690
See application file for complete search history.

(56) References Cited

FOREIGN PATENT DOCUMENTS

| JP | 08-231951 | 9/1996 |
|---|---|---|
| JP | 09-134786 | 5/1997 |
| JP | 2001-244080 A | 9/2001 |
| JP | 2002-25770 | 1/2002 |
| JP | 2002-25770 A | 1/2002 |

OTHER PUBLICATIONS

Office Action issued for corresponding Japanese Patent Application No. 2002-059536 Decision of Refusal and English translation (NAA1021046) and Decision to Dismiss the Amendment and English translation (NAA1021046).

*Primary Examiner*—Joseph Williams
(74) *Attorney, Agent, or Firm*—McDermott Will & Emery LLP

(57) ABSTRACT

An organic EL display in which organic EL devices are prevented from being degraded because of interfaces occurring between the luminescent layers and the electron transporting layers. In each of the organic EL devices, a red luminescent layer, a green luminescent layer, and a blue luminescent layer are formed on a hole transporting layer. An electron transporting layer is formed on the blue luminescent layer alone. The red luminescent layer and the green luminescent layer have the same thickness as the sum of the thicknesses of the electron transporting layer and the blue luminescent layer.

20 Claims, 4 Drawing Sheets

ORGANIC ELECTROLUMINESCENT DISPLAY AND METHOD OF MANUFACTURING THE SAME

BACKGROUND OF THE INVENTION

1. Field of the Invention

The present invention relates to an organic electroluminescent display having a plurality of organic electroluminescent devices.

2. Description of the Related Art

Organic electroluminescent displays (hereinafter, also referred to simply as "organic EL displays") are expected as alternatives to the currently prevailing liquid crystal displays, and are under development for practical application. In particular, active matrix type organic EL displays having thin film transistors (TFTs) as switching elements are regarded as the mainstream of next-generation flat displays.

In general, an organic EL display has organic EL devices in which electrons and holes are injected into a luminescent layer from an electron injecting electrode and a hole injecting electrode, respectively. The electrons and holes recombine with each other at the interface between the luminescent layer and a hole transporting layer, near the interface, or inside the luminescent layer, thereby bringing organic molecules into an excited state. These organic molecules return from the excited state to a ground state with fluorescence emission.

Here, the material of the luminescent layer can be selected to obtain luminescent elements for emitting luminescence in appropriate colors. Besides, such luminescent elements can be selected appropriately to achieve a color display. In general, luminescent elements for emitting luminescence in the three primary colors of light, or red, green, and blue, have been developed and put to use.

FIG. 1 is a plan view of an organic EL display having organic electroluminescent devices (hereinafter, also referred to simply as "organic EL devices") for emitting luminescence in red, green, and blue from their respective pixels. FIG. 1 schematically shows pixel areas of the three colors mentioned above. Starting from the left, there are provided a red pixel Rpix having a red luminescent layer, a green pixel Gpix having a green luminescent layer, and a blue pixel Bpix having a blue luminescent layer.

Each single pixel is formed in an area surrounded by gate signal lines 51 and drain signal lines 52. A first TFT 130, a switching element, is formed near the upper left intersection of the signal lines. A second TFT for driving the organic EL device is formed near the center. Organic EL devices are formed discretely in areas where hole injecting electrodes 12 of indium tin oxide (ITO) are formed.

FIG. 2 schematically shows a typical sectional view of organic EL devices having red, green, and blue, three types of luminescent layers. Starting from the left, there are the areas of the red pixel Rpix, the green pixel Gpix, and the blue pixel Bpix shown in FIG. 1. A hole injecting electrode 12, an interposed layer 14, and a hole transporting layer 16 are formed on a glass substrate 10 in order. A red luminescent layer 22, a green luminescent layer 24, and a blue luminescent layer 26 for emitting luminescence in red, green, and blue, respectively, are then formed in their respective predetermined areas on the hole transporting layer 26 so as to adjoin one another.

Subsequently, an electron transporting layer 28, an electron injecting layer 30, and an electron injecting electrode 32 are formed in this order on the three types of luminescent layers in common. In general, an organic EL display is made by vacuum deposition in a multi-chamber type organic EL manufacture system having a plurality of formation chambers. In particular, in the step of forming the red luminescent layer 22, the green luminescent layer 24, and the blue luminescent layer 26, the luminescent layers of desired colors are selectively formed in succession by mask processing in the same formation chamber.

By the way, as compared to such optical devices as liquid crystals, organic EL devices are significantly prone to degradation ascribable to secular changes. One of the reasons is that the electron transporting layer and the luminescent layer are susceptible to impurities such as water molecules and oxygen molecules. More specifically, oxidation of the organic substances constituting the electron transporting layers and the luminescent layers, and occurrence of bulk crystals near the surfaces of the respective layers can hinder electrons and holes from moving. It follows that the organic EL devices are degraded to lose desired luminescence characteristics.

SUMMARY OF THE INVENTION

The present invention has been achieved in view of the foregoing. It is thus an object of the present invention to suppress degradation of an organic EL device. Another object is to provide a method of manufacturing an organic EL device with less degradation.

One of the aspects of the present invention relates to an organic electroluminescent display. This organic EL display comprises: a first laminated structure made by laminating a hole transporting layer, a first luminescent layer containing a chelate-metal complex, and an electron injecting electrode formed above the first luminescent layer, on a hole injecting electrode in this order; and a second laminated structure made by laminating the hole transporting layer, a second luminescent layer containing a fused polycyclic aromatic compound forming no chelate-metal complex, an electron transporting layer, and the electron injecting electrode on the hole injecting electrode in this order.

Here, the "electron injecting electrode formed above the first luminescent layer" applies to both the cases where the electron injecting electrode is formed on the first luminescent layer directly and where an interposed layer is formed between the luminescent layer and the electron injecting electrode. Note that the "interposed layer," as employed herein, does not include the electron transporting layer whose chief function is to transport electrons to the luminescent layer. The term refers to such layers as an electron injecting layer for facilitating electron injection from the electron injecting electrode to the luminescent layer, and a protective layer for protecting the surface of the luminescent layer. An example thereof is a lithium fluoride layer. Similarly, interposed layers may also be arranged between the hole injecting electrode and the hole transporting layer, between the hole transporting layer and the luminescent layers, between the second luminescent layer and the electron transporting layer, and the electron transporting layer and the electron injecting electrode.

In general, the luminescent layer of an organic EL device is made chiefly of an organic compound referred to as host, to which a fluorescent dopant is added for the sake of desired luminescent characteristics. Here, the "first luminescent layer containing a chelate-metal complex" means that the chelate-metal complex is used as the host. On the other hand, the "fused polycyclic aromatic compound forming no chelate-metal complex" means that the host of the luminescent layer contains no chelate-metal complex. Here, the addition of some dopant made of a chelate-metal complex and the presence of a chelate-metal complex in the luminescent layer ascribable to mixing from the electron transporting layer made of the chelate-metal complex shall be accepted. Incidentally, the second luminescent layer containing a fused polycyclic aromatic compound including no chelate-metal complex typically emits luminescence in blue.

In terms of manufacturing processes, the luminescent layer and the electron transporting layer are typically formed on a predetermined substrate in different formation chambers. Thus, when the substrate is moved from one formation chamber to another, an interface occurs between the luminescent layer and the electron transporting layer. This interface can adsorb water molecules and oxygen molecules, promoting degradation of the organic EL device. Then, the first luminescent layer and the electron transporting layer are integrated into a single layer so that the interface which might occur between the two layers to affect the performance of the organic EL device is eliminated to suppress the degradation of the organic EL device. In general, when the host of the first luminescent layer has high electron transportability, the luminescent layer can function as an electron transporting layer.

The first luminescent layer may contain a predetermined dopant with the chelate-metal complex as the host. The electron transporting layer formed in the second laminated structure may be the same as the chelate-metal complex.

On the second luminescent layer, a chelate-metal complex having electron transportability higher than that of the host is laminated as an electron transporting layer to enhance electron injection and movement. Consequently, the luminescent layer increases in electron-hole recombination efficiency, with an improvement in luminous efficiency. For the reasons mentioned above, an electron transporting layer is required between the second luminescent layer and the electron injecting electrode.

When a fused polycyclic aromatic compound forming no chelate-metal complex is used as the host as in the second luminescent layer, bulk crystals are likely to precipitate on the surface of the luminescent layer, possibly breaking the laminated structure of the organic EL device. In other words, due to high mobility of the molecules lying on its surface, the second luminescent layer is apt to cause phase transition which can lead to crystal precipitation. The electron transporting layer is then laminated on the second luminescent layer, so that the molecule movement mentioned above is suppressed to inhibit the precipitation of bulk crystals.

The chelate-metal complex may contain a metal ion belonging to the group 2 or group 3 of the periodic table. Examples of the metal belonging to the group 2 of the periodic table are beryllium (Be), magnesium (Mg), and zinc (Zn). Examples of the metal belonging to the group 3 of the periodic table are aluminum (Al), gallium (Ga), and indium (In).

The chelate-metal complex may be an aluminum-quinoline complex (Alq3) or a bis(benzo-quinolinato) beryllium complex (BeBq2). In particular, the structure in which Alq3 or BeBq3 is used as the host of the luminescent layer is known for its high characteristic stability and luminous efficiency. With Alq3 as the host, the luminescent layer has electron transportability of fully satisfying level and thus is capable of functioning as an electron transporting layer. When Alq3 is used as the host of the first luminescent layer, the electron transporting layer is omitted and the luminescent layer is given such a thickness as takes account of the thickness of the electron transporting layer to be provided originally. This can eliminate the interface which has conventionally occurred between the luminescent layer and the electron transporting layer with an adverse effect on the performance of the organic EL device. That is, it is possible to preclude the degradation of the organic EL device ascribable to the interface.

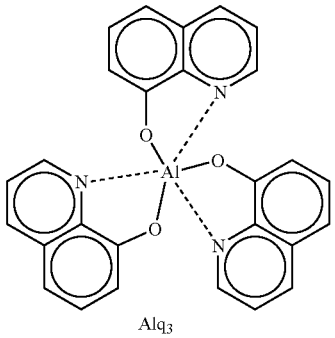

Alq$_3$

[Formula 1]

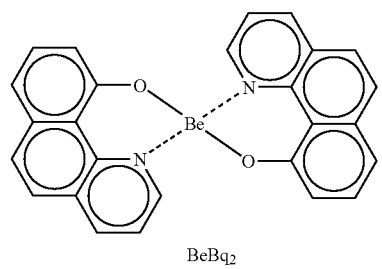

BeBq$_2$

[Formula 2]

The electron transporting layer may also be made of Alq3. The fused polycyclic aromatic compound of the second luminescent layer may be anthracene or a derivative thereof. A lithium fluoride layer may be formed between the first luminescent layer and the electron injecting electrode and between the second luminescent layer and the electron injecting electrode. The lithium fluoride layer is provided to facilitate electron injection from the electron injecting electrode to the luminescent layer in the absence of the electron transporting layer.

Another aspect of the present invention relates to a method of manufacturing an organic electroluminescent display. This method comprises the steps of: forming a hole injecting electrode and a hole transporting layer on a glass substrate in this order; forming a first luminescent layer containing a chelate-metal complex in a predetermined area on the hole transporting layer; forming a second luminescent layer containing a fused polycyclic aromatic compound forming no chelate-metal complex and an electron transporting layer in a remaining predetermined area on the hole transporting layer in this order; and forming an electron injecting electrode on the first luminescent layer and the electron transporting layer after the completion of the two preceding steps. Before the formation of the electron injecting electrode, an interposed layer such as an electron injecting layer and a protective layer may be formed on the first luminescent layer and the electron transporting layer. The electron injecting layer is made of such material as lithium fluoride and magnesium oxide.

In general, after the formation of the hole transporting layer, luminescent layers corresponding to red, green, and blue colors are selectively formed in their respective predetermined areas on the hole transporting layer in an identical formation chamber by using masks. The substrate provided with the luminescent layers is moved to another formation chamber, in which an electron transporting layer is formed over the luminescent layers. In this manufacturing method, interfaces can occur between the luminescent layers and the electron transporting layer at the time of movement from one formation chamber to the other. In addition, since the three types of luminescent layers are formed in an identical formation chamber, the materials to be used as the dopants of the luminescent layers cause cross contamination with deterioration in product yield.

As described above, the luminescent layer containing a chelate-metal complex as the host and the electron transporting layer made of a chelate-metal complex can be integrated into a luminescent layer. Thus, after the hole transporting layer is formed, the red luminescent layer, the green luminescent layer, and the blue luminescent layer and the electron transporting layer can be formed in respective separate formation chambers to eliminate the interfaces which have occurred of the red and green luminescent layers with the electron transporting layers formed thereon. It is also possible to avoid cross contamination of the dopants mentioned above.

As above, according to the present invention, when the host of the luminescent layer and the electron transporting layer are both made of a chelate-metal complex, it is possible to omit the electron transporting layer and assign the function to the luminescent layer. This can eliminate the interface which has conventionally occurred between the first luminescent layer and the electron transporting layer with an adverse effect on the performance of the organic EL device.

It is to be noted that any arbitrary combination or rearrangement of the above-described structural components and so forth are all effective as and encompassed by the present embodiments.

Moreover, this summary of the invention does not necessarily describe all necessary features so that the invention may also be sub-combination of these described features.

DETAILED DESCRIPTION OF THE PREFERRED EMBODIMENT

The invention will now be described based on preferred embodiments which do not intend to limit the scope of the present invention but exemplify the invention. All of the features and the combinations thereof described in the embodiment are not necessarily essential to the invention.

The present embodiment provides an organic EL display having a plurality of organic EL devices, in which the electron transporting layers formed on the red and green luminescent layers, having an aluminum-quinoline complex as their host, are omitted and the function of the electron transporting layers is assigned to the respective luminescent layers. Electron transporting layers are formed only on the blue luminescent layers whose hosts are a fused polycyclic aromatic compound containing no aluminum-quinoline complex.

Figure 3:
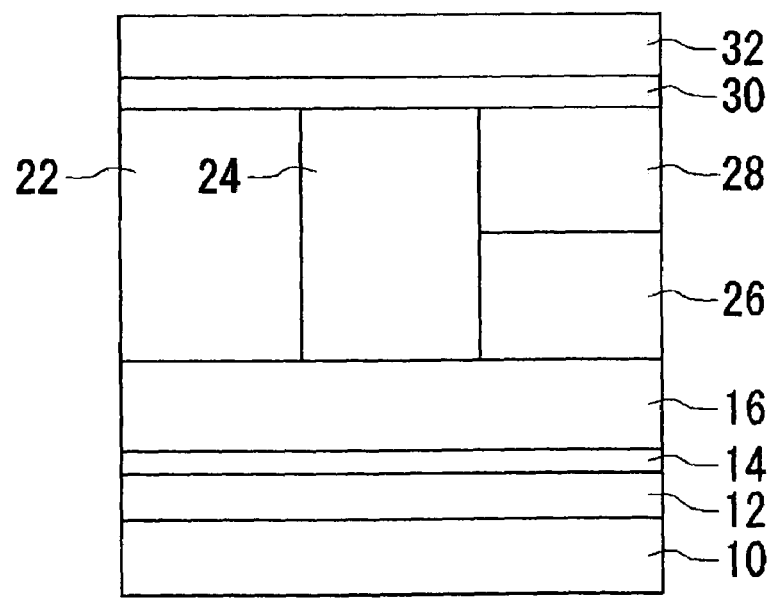
FIG. 3 is a sectional view schematically showing the structure including organic EL devices having three types of luminescent layers for emitting luminescence in red, green, and blue according to an embodiment.

FIG. 3 schematically shows a sectional view of pixels comprising organic EL devices according to the present embodiment. A hole injecting electrode 12, an interposed layer 14 of fluorocarbon, and a hole transporting layer 16 are formed on a glass substrate 10 in order.

The hole injecting electrode 12 is made of such material as ITO, tin oxide ($SnO_2$), or indium oxide ($In_2O_3$). ITO is typically used because of its hole injection efficiency and low surface resistance. The hole transporting layer 16 is made of such material as N,N'-di(naphthalene-1-yl)-N,N'-diphenyl-benzidine

[Formula 3]

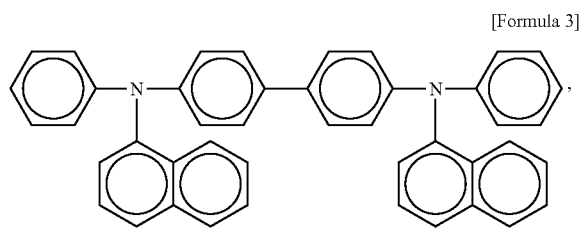

4,4',4''-tris(3-methylphenylphenylamino)triphenylamine (MTDATA)

[Formula 4]

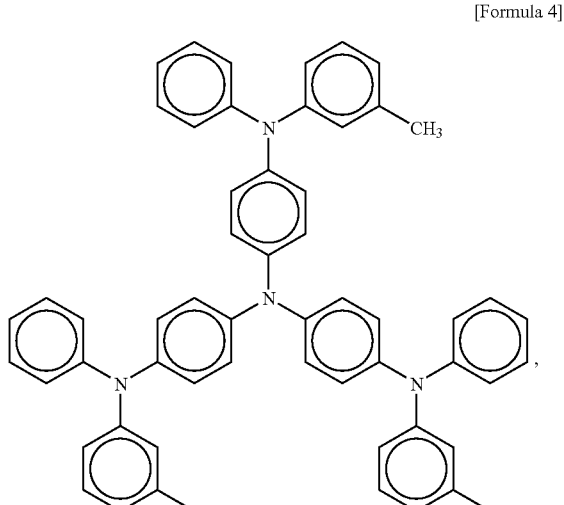

MTDATA or N,N'-diphenyl-N,N'-di(3-methylphenyl)-1,1'-biphenyl-4,4'-diamine.

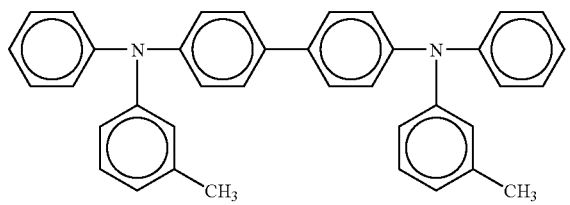

[Formula 5]

Subsequently, a red luminescent layer 22, a green luminescent layer 24, and a blue luminescent layer 26 for emitting luminescence in red, green, and blue, respectively, are formed in their respective predetermined areas on the hole transporting layer 16 so as to adjoin one another.

The red luminescent layer 22 and the green luminescent layer 24 contain Alq3, BeBq2, or other chelate-metal complexes as the host. A trace quantity of such dopant as rubrene

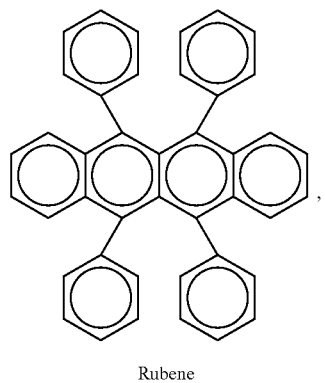

Rubene the compound specified with Formula 7 disclosed in Japanese Unexamined Patent Application Publication No. 2002-38140

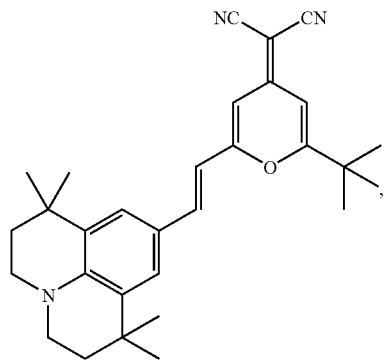

[Formula 7]

and quinacridone and its derivatives is added thereto.

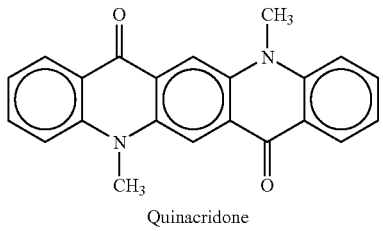

[Formula 8]

Quinacridone

Meanwhile, the host of the blue luminescent layer 26 is a fused polycyclic aromatic compound which is an anthracene derivative such as tert-butyl-substituted dinaphthylanthracene specified with a chemical formula 9 disclosed in Japanese Unexamined Patent Application Publication No. 2002-25770.

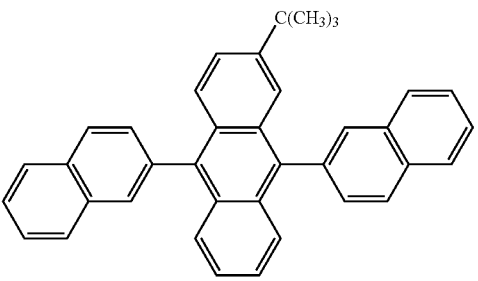

[Formula 9]

Such a dopant as tert-butyl-substituted perylene (TBP) disclosed in Japanese Unexamined Patent Application Publication No. 2002-25770 is added thereto.

Moreover, an electron transporting layer 28 is formed on the blue luminescent layer 26 alone. Here, the electron transporting layer 28 is made of such material as Alq3. In general, the material of the electron transporting layer 28 requires three types of characteristics of high electron transportability, high electron affinity, and high glass transition temperature. In view of stability of these characteristics, Alq3 is often used as the material of the electron transporting layer 28.

The host of the red luminescent layer 22 and the green luminescent layer 24, or the chelate-metal complex such as Alq3, has electron transportability high enough to be used as the material of the electron transporting layer 28. Thus, the luminescent layers containing the chelate-metal complex as the host can function as electron transporting layers. On the other hand, the host of the blue luminescent layer 26 is lower than the material of the electron transporting layer 28 in electron transportability. Thus, the electron transporting layer 28 is formed on the blue luminescent layer 26.

An electron injecting layer 30 and an electron injecting electrode 32 are formed in this order over the red luminescent layer 22, the green luminescent layer 24, the electron transporting layer 28 formed on the blue luminescent layer 26 in common. Here, the electron injecting electrode 32 is made of such material as an aluminum alloy containing a trace quantity of Li (AlLi), a magnesium indium alloy (MgIn), or a magnesium silver alloy (MgAg). The electron injecting electrode 32 may be an electrode of double-layer structure in which a lithium fluoride layer and an aluminum layer are formed in this order on the side to contact with the organic layers.

Figure 1:
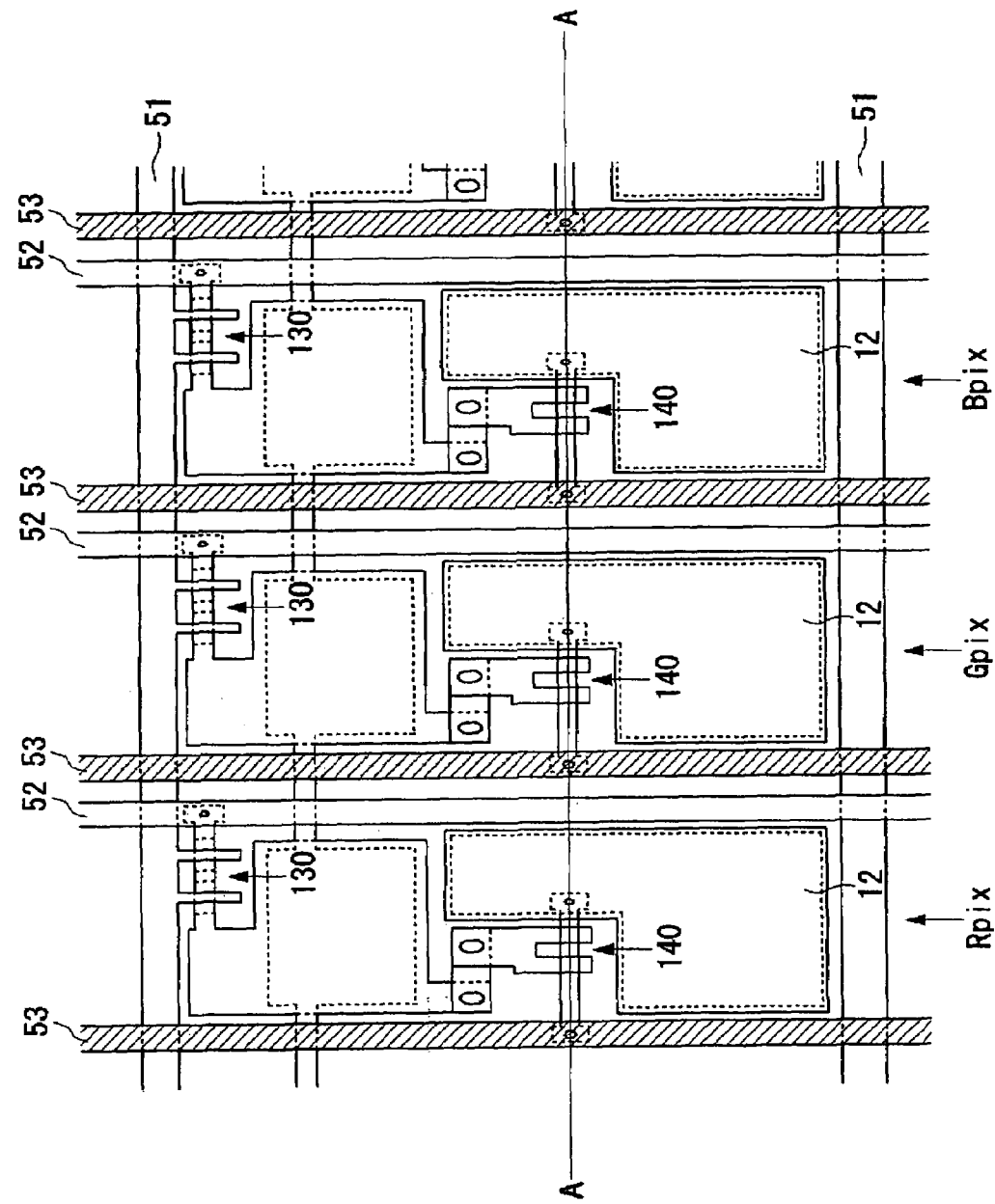
FIG. 1 is a plan view of an active matrix type organic EL display, showing the areas of red, green, and blue, three pixels in particular.
Figure 2:
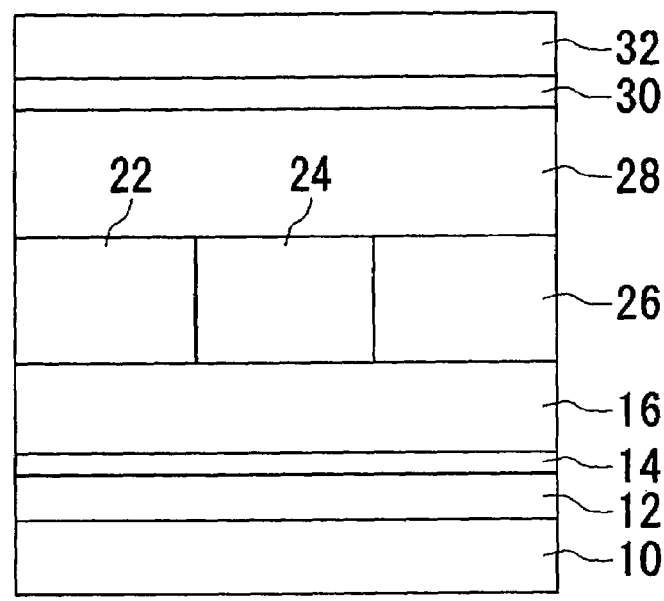
FIG. 2 is a sectional view schematically showing a typical structure including organic EL devices having three types of luminescent layers for emitting luminescent in red, green, and blue according to a conventional example.

Now, description will be given of a difference from the sectional view shown in the conventional example of FIG. 1. In FIG. 1, the electron transporting layer 28 is formed over the red luminescent layer 22, the green luminescent layer 24, and the blue luminescent layer 26 in common. In the present embodiment, the electron transporting layer 28 is formed on the blue luminescent layer 26 alone, not over the red luminescent layer 22 or the green luminescent layer 24. The red luminescent layer 22 and the green luminescent layer 24 of the present embodiment have the same thickness as the sum of the thicknesses of the blue luminescent layer 26 and the electron transporting layer 28, whereas this is not restrictive.

FIGS. 4(a) to 4(d) are diagrams schematically showing the steps for manufacturing organic EL devices having the foregoing structure. Note that the step of forming TFTs will be omitted here.

Figure 4A:
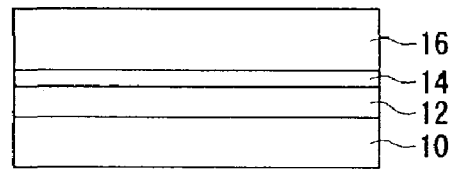
FIGS. 4(a) to 4(d) are diagrams showing the steps for manufacturing organic EL devices having three types of luminescent layers for emitting luminescence in red, green, and blue according to the embodiment.
Figure 4B:
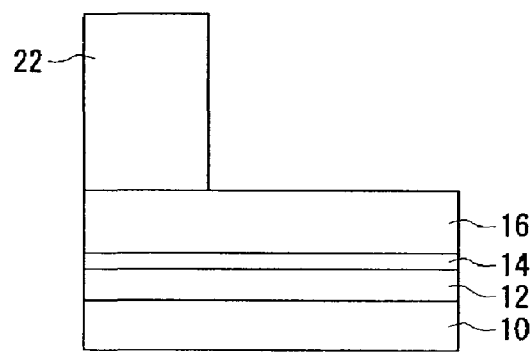
Figure 4C:
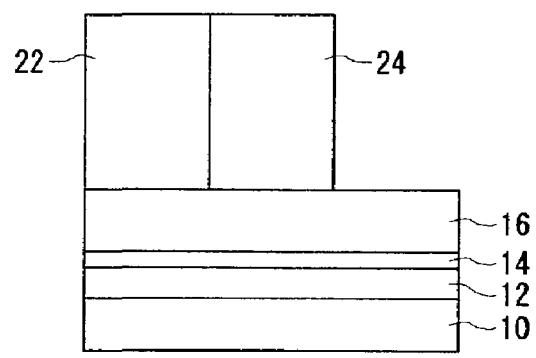
Figure 4D:
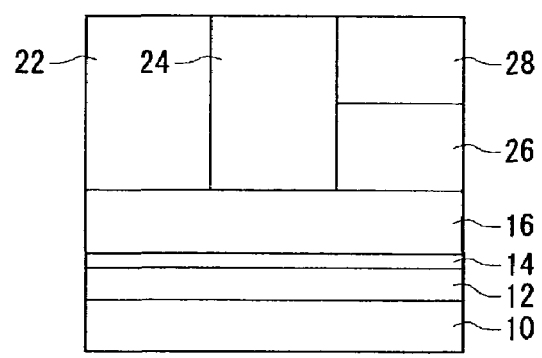

Initially, as shown in FIG. 4(a), a hole injecting electrode 12, an interposed layer 14 of fluorocarbon, and a hole transporting layer 16 are formed on a glass substrate 10 in this order. Subsequently, as shown in FIG. 4(b), a red luminescent layer 22 is formed in a predetermined area on the hole transporting layer 16. Similarly, as shown in FIG. 4(c), a green luminescent layer 24 is formed in a predetermined area on the hole transporting layer 16 to the same thickness as that of the red luminescent layer 22. Then, as shown in FIG. 4(d), a blue luminescent layer 26 is formed in a predetermined area on the hole transporting layer 16 to a thickness a half that of the red luminescent layer 22 and the green luminescent layer 24. Next, an electron transporting layer 28 is formed on the blue luminescent layer 26 such that the total thickness of the blue luminescent layer 26 and the electron transporting layer 28 is the same as the thickness of the red luminescent layer 22 and the green luminescent layer 24.

Subsequently, an electron injecting layer 30 and an electron injecting electrode 32 are formed over the red luminescent layer 22, the green luminescent layer 24, and the electron transporting layer 28 in order. The result is the structure shown in FIG. 3. Here, the three steps for forming the red luminescent layer 22, the green luminescent layer 24, and the blue luminescent layer 26 and the electron transporting layer 28 are performed in different formation chambers.

EXAMPLE

Figure 5:
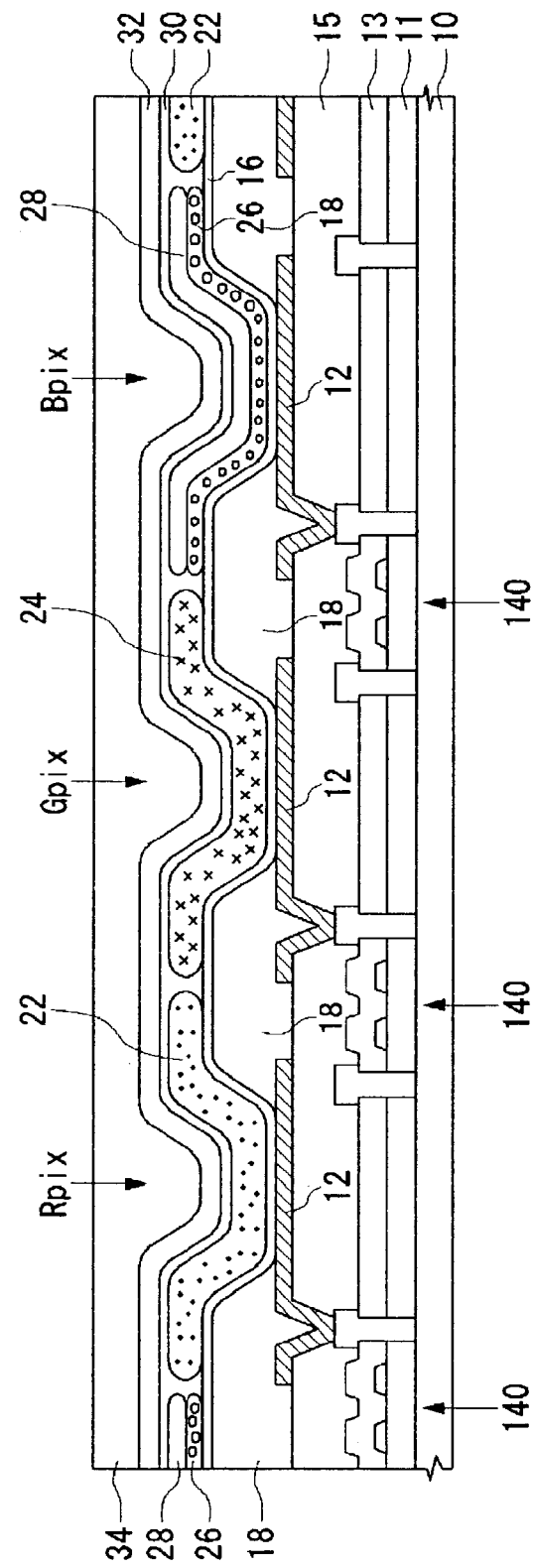
FIG. 5 is a sectional view showing the structure of an active matrix display to which organic EL devices having three types of luminescent layers for emitting luminescence in red, green, and blue according to the embodiment are applied.

Hereinafter, the present invention will be described in detail in conjunction with an example of embodiment. It should be noted that the present invention is not limited to the following example unless departing from the gist thereof. In this example, organic EL devices having the structure of the present embodiment were applied to an active matrix type organic EL display. FIG. 5 shows the A—A section of the display in FIG. 1. The present invention is characterized by the laminated configuration of the luminescent layers and the electron transporting layers. Description will thus be omitted in part since the configuration other than the laminated configuration can be achieved by known techniques.

An active layer 11 was formed on a glass substrate 10. The active layer 11 was provided with second TFTs 140 necessary to drive organic EL devices. An insulating film 13 and a first planarization layer 15 were formed thereon. Hole injecting electrodes 12 made of transparent ITO were formed thereon, followed by an insulative second planarization layer 18. This completed a TFT substrate for organic EL devices to be formed on. Here, the second planarization layer 18 was not formed all over the hole injecting electrodes 12, but formed locally so as to cover the areas where the second TFTs 140 were formed and in such a shape that it would not cause disconnection of the hole injecting electrodes 12 and film layers to be described later.

Next, an interposed layer 14 was formed to cover the hole injecting electrodes 12 and the second planarization layer 18. Red luminescent layers 22, green luminescent layers 24, and blue luminescent layers 26 were formed thereon in their respective predetermined areas.

Here, the red luminescent layers 22 contained Alq3 as the host, being doped with 2% of the compound specified with Formula 7 and 10% of rubrene. The green luminescent layers 24 contained Alq3 as the host, being doped with 1% of quinacridone derivative and 10% of the compound specified with Formula 8. The blue luminescent layers 26 contained the compound specified with Formula 8 as the host, being doped with 2% of TBP. The red luminescent layers 22 and the green luminescent layers 24 both were 75 nm in thickness. The blue luminescent layers 26 were 37.5 nm in thickness. Electron transporting layers 28 were formed on the respective blue luminescent layers 26 to a thickness of 37.5 nm.

An electron injecting layer 30 of lithium fluoride was formed over the electron transporting layers 28, the red luminescent layers 22, and the green luminescent layers 24 in common. Then, an electron injecting electrode 32 was formed thereon.

COMPARATIVE EXAMPLE

Table 1 shows the results of comparison between a conventional example and the example according to the foregoing configuration. In the organic EL devices of the conventional example, the red luminescent layers 22 and the green luminescent layers 24 were given a thickness of 37.5 nm. The electron transporting layers 28 formed thereon were also given a thickness of 37.5 nm.

TABLE 1

| LUMINOUS COLOR | LUMINOUS EFFICIENCY (cd/A) | LIFE (h) | INITIAL LUMINANCE (cd/m$^2$) |
|---|---|---|---|
| GREEN (CONVENTIONAL EXAMPLE) | 5.9 | 2000 | 800 |
| GREEN (EXAMPLE) | 6.0 | 3000 | 800 |
| RED (CONVENTIONAL EXAMPLE) | 2.1 | 1000 | 500 |
| RED (EXAMPLE) | 2.3 | 1500 | 500 |

With the green organic EL devices, the luminous efficiency improved slightly from 5.9 cd/A to 6.0 cd/A. The life improved 2000 hours to 3000 hours, or 1.5 times. Here, the initial luminance was 800 cd/m$^2$. The point of time at which the luminance decreased by half was called the life. As concerns the red organic EL devices, the luminous efficiency improved from 2.1 cd/A to 2.3 cd/A. The life improved 1000 hours to 1500 hours, or 1.5 times again. Here, the initial luminance was 500 cd/m$^2$. The life was the point of time at which the luminance decreased by half.

As compared to the structure having the electron transporting layer of the conventional example, the green and red organic EL devices having no electron transporting layer showed significant improvement in life in particular. The reason seems that the elimination of the interfaces between the luminescent layers and the electron transporting layers can suppress the progress of degradation.

As above, according to the examples, the electron transporting layers 28 conventionally formed on the red luminescent layer 22 and the green luminescent layer 24 can be removed to eliminate the interfaces between red luminescent layer 22 and the electron transporting layer 28 and between the green luminescent layer 24 and the electron transporting layer 28. These interfaces have contributed to the adsorption of water molecules and oxygen molecules and the promoted degradation of the organic EL devices. Since the interfaces between the luminescent layers and the electron transporting layers are eliminated, it is possible to exhibit stable luminous characteristics with less degradation of the red luminescent layer 22 and the green luminescent layer 24.

To achieve organic EL devices having this laminated structure, the steps of forming the red luminescent layer 22, the green luminescent layer 24, and the blue luminescent layer 26 and the electron transporting layer 28, respectively, are performed in three different types of formation chambers in a multi-chamber type organic EL manufacturing system. Consequently, it is possible to avoid cross contamination of the materials of the organic EL devices which has conventionally occurred when the three types of luminescent layers are formed in an identical formation chamber.

According to the present invention, it is possible to suppress the occurrence of interfaces that occur between the luminescent layers and the electron transporting layers with an adverse effect on the performance of the organic EL device. The organic EL devices can thus be prevented from degradation ascribable to the interfaces. In another aspect, it is possible to avoid cross contamination of the materials of the organic layers which has occurred in forming a plurality of organic EL devices for emitting desired colors.

Although the present invention has been described by way of exemplary embodiments, it should be understood that many changes and substitutions may further be made by those skilled in the art without departing from the scope of the present invention which is defined by the appended claims.

What is claimed is:

1. An organic electroluminescent display, comprising:
   a first laminated structure made by laminating a hole transporting layer, a first luminescent layer containing a chelate-metal complex, and an electron injecting electrode formed above the first luminescent layer, on a hole injecting electrode in this order; and
   a second laminated structure made by laminating the hole transporting layer, a second luminescent layer containing a fused polycyclic aromatic compound forming no chelate-metal complex, an electron transporting layer, and the electron injecting electrode on the hole injecting electrode in this order.

2. The organic electroluminescent display according to claim 1, wherein:
   the first luminescent layer contains a predetermined dopant with the chelate-metal complex as a host; and
   the electron transporting layer formed in the second laminated structure is the same as the chelate-metal complex.

3. The organic electroluminescent display according to claim 1, wherein the chelate-metal complex contains a metal ion belonging to the group 2 or group 3 of the periodic table.

4. The organic electroluminescent display according to claim 3, wherein the chelate-metal complex is any one of an aluminum-quinoline complex and a bis (benzo-quinolinato) beryllium complex.

5. The organic electroluminescent display according to claim 1, wherein the electron transporting layer is made of an aluminum-quinoline complex.

6. The organic electroluminescent display according to claim 1, wherein the fused polycyclic aromatic compound of the second luminescent layer is any one of anthracene and a derivative thereof.

7. The organic electroluminescent display according to claim 2, wherein the fused polycyclic aromatic compound of the second luminescent layer is any one of anthracene and a derivative thereof.

8. The organic electroluminescent display according to claim 3, wherein the fused polycyclic aromatic compound of the second luminescent layer is any one of anthracene and a derivative thereof.

9. The organic electroluminescent display according to claim 4, wherein the fused polycyclic aromatic compound of the second luminescent layer is any one of anthracene and a derivative thereof.

10. The organic electroluminescent display according to claim 5, wherein the fused polycyclic aromatic compound of the second luminescent layer is any one of anthracene and a derivative thereof.

11. The organic electroluminescent display according claim 1, wherein a lithium fluoride layer is formed between the first luminescent layer and the electron injecting electrode and between the second luminescent layer and the electron injecting electrode.

12. The organic electroluminescent display according to claim 2, wherein a lithium fluoride layer is formed between the first luminescent layer and the electron injecting electrode and between the second luminescent layer and the electron injecting electrode.

13. The organic electroluminescent display according to claim 3, wherein a lithium fluoride layer is formed between the first luminescent layer and the electron injecting electrode and between the second luminescent layer and the electron injecting electrode.

14. The organic electroluminescent display according to claim 4, wherein a lithium fluoride layer is formed between the first luminescent layer and the electron injecting electrode and between the second luminescent layer and the electron injecting electrode.

15. The organic electroluminescent display according to claim 5, wherein a lithium fluoride layer is formed between the first luminescent layer and the electron injecting electrode and between the second luminescent layer and the electron injecting electrode.

16. The organic electroluminescent display according to claim 6, wherein a lithium fluoride layer is formed between the first luminescent layer and the electron injecting electrode and between the second luminescent layer and the electron injecting electrode.

17. The organic electroluminescent display according to claim 7, wherein a lithium fluoride layer is formed between the first luminescent layer and the electron injecting electrode and between the second luminescent layer and the electron injecting electrode.

18. The organic electroluminescent display according to claim 8, wherein a lithium fluoride layer is formed between the first luminescent layer and the electron injecting electrode and between the second luminescent layer and the electron injecting electrode.

19. The organic electroluminescent display according to claim 9, wherein a lithium fluoride layer is formed between the first luminescent layer and the electron injecting electrode and between the second luminescent layer and the electron injecting electrode.

20. The organic electroluminescent display according to claim 10, wherein a lithium fluoride layer is formed between the first luminescent layer and the electron injecting electrode and between the second luminescent layer and the electron injecting electrode.

* * * * *